United States Patent [19]

Gounji et al.

[11] 4,281,298

[45] Jul. 28, 1981

[54] FLEXURAL TRANSDUCER

[75] Inventors: Takashi Gounji, Kawasaki; Yoshihiko Kasai, Yokahama, both of Japan

[73] Assignee: Fujitsu Limited, Japan

[21] Appl. No.: 93,208

[22] Filed: Nov. 13, 1979

[30] Foreign Application Priority Data

Oct. 13, 1978 [JP] Japan ................................ 53-138813
Dec. 27, 1978 [JP] Japan ................................ 53-159980
Oct. 16, 1979 [JP] Japan ................................ 54-133356

[51] Int. Cl.³ .................... H03H 9/125; H03H 9/50; H03H 9/54; H01L 41/18
[52] U.S. Cl. .................................. 333/186; 310/357; 310/370; 333/189; 333/197; 333/200
[58] Field of Search .............................. 333/186–189, 333/197–200, 141, 147; 310/311, 320, 322, 323, 325, 328, 330, 331, 357–359, 370

[56] References Cited

U.S. PATENT DOCUMENTS 3,376,521  4/1968  Traub ................................. 333/186
3,408,514  10/1968  Adamietz et al. ............... 333/186 X

OTHER PUBLICATIONS

Japanese Unexamined Utility Model Publication, No. JITSUGANSO 54-35713, filed Oct. 30, 1972, Laid Open Sep. 12, 1979 as JIKKAISHO 54-131446, Applicant–Nippon Telegraph and Telephone Public Corp.

Primary Examiner—Marvin L. Nussbaum
Attorney, Agent, or Firm—Staas & Halsey

[57] ABSTRACT

A flexural electromechanical transducer composed of a constant-modulus alloy material and a piezoelectric ceramic material having a high electromechanical coupling coefficient. In the transducer, the piezoelectric ceramic material is polarized in one direction and a specified frequency signal is applied to the piezoelectric ceramic material in a direction parallel to the residual polarization direction of the piezoelectric material for obtaining a thickness-shear vibration. The thickness-shear vibration of the piezoelectric material in turn causes the flexural vibration of the transducer. The transducer achieves a high quality factor Q, a low capacitance ratio r, good spurious characteristics, and low impedance.

23 Claims, 23 Drawing Figures

FLEXURAL TRANSDUCER

BACKGROUND OF THE INVENTION

This invention relates to a flexural transducer and, more particularly, to a flexural electromechanical transducer formed of a constant-modulus alloy material and a piezoelectric ceramic material with a large electromechanical coupling coefficient.

Mechanical frequency filters which are composed of mechanical resonant and coupling elements are now being commonly used to produce certain filter frequency characteristics and are particularly advantageous in commercial applications because of their small structural size. These filters are equipped at their inputs and outputs with electromechanical transducers so that they can be used in electric circuits. In esssence, the mechanical filters convert an electrical signal into a mechanical signal and extract an electrical output signal after filtering is achieved by the mechanical resonators and coupling elements. Ultrasonic waves is a common medium in mechanical filters. Transducers having the piezoelectric effect are also commonly used in the mechanical filters to convert the input electrical signal into the mechanical signal or to convert the mechanical signal into the output electrical signal.

A flexural transducer is particularly useful in band pass mechanical filters for low frequencies, for reasons which will be described hereinafter. Applications of a flexural transducer include use in various kinds of communication and control systems, particularly channel filters for carrier transmission and channel translating equipment. In these systems and equipment, as well as in other expanding fields of application, there is need for high performance mechanical filters having stringent filter characteristics. Such high performance mechanical channel filters, furthermore, must be highly reliable and manufactured in the most cost-effective way while ensuring the necessary filter characteristics. For example, several key factors in minimizing cost is to hold the overall filter structure to a minimum size, provide a filter which is simple in structure, standardized in dimension, and which does not require close dimensional tolerances or complicated assembly. Every component of the mechanical filter must be considered in meeting the above requirements. One key component is the transducer.

Figure 1:
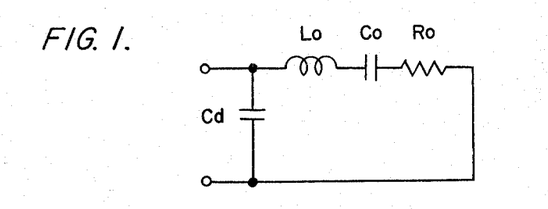
FIG. 1 is a circuit diagram which is an electrical equivalent of a piezoelectric transducer using the L, C and R electrical equivalent elements.

As is well known in the art, the mechanical characteristics of a piezoelectric transducer can be translated into an equivalent electrical circuit, and vice versa. An equivalent electrical circuit for a conventional transducer is depicted in FIG. 1, wherein the components L, C and R are the electrical equivalents of the mechanical properties of the transducer. More specifically, as shown in FIG. 1, $L_0$, $C_0$ and $R_0$ represent respectively the equivalent inductance, equivalent capacitance, and the equivalent resistance of the series resonance of the transducer, while Cd represents the damped capacitance of the piezoelectric crystal or plate.

The performance of a transducer described above is generally measured by a capacitance ratio r and a quality factor Q, as expressed by the following:

$r = C_d/C_0$ $Q = \omega L_0/R_o$, wherein the symbol $\omega$ is a series resonant angular frequency of the transducer.

In obtaining desired filter qualities for a mechanical filter using piezoelectric transducers, it is also necessary to take into consideration the realizable band width of the mechanical filter. The realizable bandwidth of a filter represented by $\Delta f$ is inversely proportional to the capacitance ratio r of the transducer as expressed by the following equation:

$\Delta f \propto 1/r$

In view of this inverse proportion, it can be seen that a wide pass band can be achieved for a mechanical filter when the capacitance ratio r of the transducer is small.

Piezoelectric transducers now used for mechanical filters are commonly of a flexural bar-type configuration. The flexural bar-type transducers can be further classified in accordance with their structural arrangement, as will now be described with reference to FIGS. 2 and 3.

Figure 2:
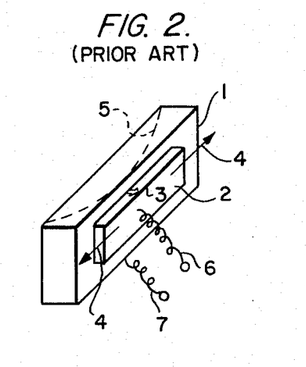
FIG. 2 is a perspective view of one example of a conventional flexural bar-type transducer.

One example of a conventional flexural bar-type transducer is depicted in FIG. 2. This transducer comprises an elongated metal plate 1 formed of a constant-modulus alloy material and an elongated piezoelectric ceramic plate 2 coupled to the metal plate at one outer surface along a longitudinal direction of the metal plate. The ceramic plate 2 has a residual polarization in the thickness direction of the metal plate 1 as indicated by an arrow 3. Lead wires 6 and 7 are respectively connected to the piezoelectric ceramic plate 2 and metal plate 1. Because of the above transducer's structure, when an AC voltage of a specified frequency is applied across the lead wires 6 and 7, the piezoelectric ceramic plate 2 vibrates by "extension and compression" in a direction indicated by an arrow 4. The vibration of the piezoelectric plate in turn causes flexural vibration of the transducer shown by a dotted line 5.

The flexural transducer illustrated in FIG. 2 is principally used in narrow band pass filters for lower frequencies because it is very stable for temperature and aging variations. It is also simple in construction and easily fabricated. However, this transducer is not effective in numerous mechanical filter applications because a large realizable band width $\Delta f$ and a low impedance cannot be achieved. This is due primarily to the piezoelectric ceramic plate 2 of the transducer providing electromechanical conversion of signals in the "extension and compression" vibrational mode. This phenomenon, of course, results in a very small or low electromechanical coupling coefficient of vibration, typically 0.3. The small coupling coefficient in turn results in a very large capacitance ratio r for the transducer. Since the realizable band width $\Delta f$ of a mechanical filter is inversely proportional to the capacitance ratio r of the transducer, a very narrow bandwidth and high impedance results.

To widen the band width $\Delta f$ of a mechanical filter employing the above-described transducer having a large capacitance ratio r and to obtain impedance matching with an external electrical circuit, an additional electrical circuit of inductance and capacitance elements, i.e., L's and C's, must be used or connected to the input/output sides of the filter. This addition, however, is unsatisfactory because the physical size of that electrical circuit usually is equal to or becomes larger than the physical size of the mechanical filter consisting of the transducers, resonators and couplers. Accordingly, the overall structure and costs of the system are increased, rather than reduced.

Figure 3:
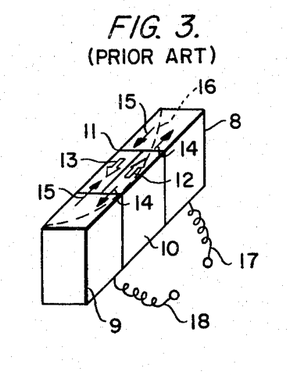
FIG. 3 is a perspective view of another example of a conventional flexural bar-type transducer.

Another example of a conventional flexural bar-type transducer is depicted in FIG. 3. This transducer has two piezoelectric ceramic plates 10 and 11 positioned between and mechanically coupled to a pair of metal plates 8 and 9. The piezoelectric ceramic plates 10 and 11 have opposite residual polarizations, as indicated respectively by arrows 12 and 13, but are in a direction which coincides with the longitudinal direction of the transducer. Lead wires 17 and 18 are respectively connected to the metal plates 8 and 9. Because of the above transducer's structure, when an AC voltage of a specified frequency is applied across the lead wires 17 and 18, the piezoelectric ceramic plates 10 and 11 vibrate respectively as indicated by arrows 14 and 15 in a "thickness-extensional" mode. This vibration in turn causes the flexural vibration of the transducer shown by the dotted line 16.

The transducer of FIG. 3 has an electromechanical coupling coefficient of vibration, typically 0.5 to 0.6, which is larger than that of the first flexural bar-type transducer shown in FIG. 2. This is due principally to the thickness-extensional vibrational mode of the piezoelectric ceramic plate. In view of this, the capacitance ratio r of the transistor becomes smaller, and a mechanical filter having a wider pass band width Δf can be achieved without using an additional electrical circuit of inductance and capacitance elements. Despite the above advantages, the transducer of FIG. 3 has numerous disadvantages because it uses more components and requires that the pair of piezoelectric ceramic plates be assembled in the transducer with reverse residual polarization directions. Accordingly, a more complicated overall structure results, and the costs and fabrication time of the transducer increase.

As can be seen from the foregoing remarks, electromechanical transducers of high performance characteristics which are simple in construction, reliable, and easily manufactured have yet to be satisfactorily achieved for the current and expanding fields of application, such as in mechanical channel filters.

SUMMARY OF THE INVENTION

Accordingly, it is a primary object of this invention to eliminate the above-described problems in conventional transducers.

Another object of this invention is to provide a flexural transducer extremely suitable for mechanical frequency filters, particularly channel filters used for channel translating and carrier transmission equipment.

Yet another object of this invention is to provide a simplified structure for a flexural transducer.

Another object of this invention is to provide a flexible transducer which is more easily and more cost effectively fabricated.

Still another object of this invention is to obtain high performance and reliability in a flexural transducer.

Yet another object of this invention is to provide a low capacitance ratio r, a high quality factor Q, and good spurious characteristics in a flexural transducer.

Another object of this invention is to obtain a high electromechanical coupling coefficient and low impedance characteristics in a flexural transducer.

Additional objects and advantages of the invention will be set forth in part in the description which follows, and in part will be obvious from the description, or may be learned by practice of the invention. The objects and advantages of the invention may be realised and obtained by means of the instrumentalities in combinations particularly pointed out in the appended claims.

To achieve the foregoing objects and in accordance with the purpose of the invention, as embodied and broadly described herein, the flexural filter comprises (1) at least one constant-modulus alloy plate; (2) a piezoelectric ceramic plate mechanically coupled to the constant-modulus alloy plate and having a residual polarization in one direction and surfaces parallel to the polarization direction; and (3) lead means electrically connected to the piezoelectric ceramic plate surfaces parallel to the polarization direction for applying a specified frequency signal to the parallel surfaces and obtaining a thickness-shear vibration mode of the piezoelectric ceramic plate and flexural vibration of the transducer.

In one preferred embodiment of the transducer, the residual polarization direction of the piezoelectric ceramic plate is perpendicular to the longitudinal direction of the transducer. In another modification, however, the residual polarization direction of the piezoelectric ceramic plate is the same as the longitudinal direction of the transducer. In different embodiments, the transducer can have a bar-type or tuning fork-type configuration.

In yet another preferred embodiment of the flexural transducer, there is included (1) a first constant-modulus alloy plate; (2) a second constant-modulus alloy plate; (3) a third constant-modulus alloy plate; (4) a first piezoelectric ceramic plate positioned between and mechanically coupled to the first and second constant-modulus alloy plates; (5) a second piezoelectric ceramic plate positioned between and mechanically coupled to the second and third constant-modulus alloy plates, these first and second ceramic plates having opposite residual polarizations to each other in a direction perpendicular to the longitudinal direction of the transducer and having surfaces parallel to the polarization direction; and (6) lead means electrically connected to the piezoelectric ceramic plate surfaces parallel to the polarization direction for applying a specific frequency signal to these parallel surfaces and obtaining a thickness-shear vibration mode of the ceramic plates and flexural vibration of the transducer, the lead means comprising first, second, and third supporting and lead wires respectively connected to the first, second, and third alloy plates at flexural vibration nodes.

In another preferred embodiment, the flexural transducer comprises (1) first and second constant-modulus alloy plates; (2) first and second piezoelectric ceramic plates positioned between and mechanically coupled to the first and second alloy plates, the first and second ceramic plates having opposite residual polarizations to each other in a direction perpendicular to the longitudinal direction of the transducer; and (3) lead means electrically connected to the ceramic plates for applying a specified frequency signal thereto and obtaining a thickness-shear vibration mode of the transducer, the lead means comprising first lead means connected to the first alloy plate, second lead means connected to the second alloy plate, and third lead means positioned between and connected to the first and second ceramic plates.

Preferably, the third lead means of the flexural transducer immediately described above comprises a supporting and electrode metal plate having a first portion positioned between and mechanically coupled to the piezoelectric ceramic plates and a second portion extending out from between the ceramic plates. The first and second lead means of this flexural transducer for use in a mechanical filter also preferably comprise first and second mechanical couplers which are respectively connected to the first and second constant-modulus alloy plates and a mechanical resonator. A frequency is then applied between the supporting and electrode metal plate and the mechanical resonator.

BRIEF DESCRIPTION OF THE DRAWINGS

The accompanying drawings, which are incorporated and constitute a part of the specification, illustrate embodiments of the invention and, together with a description, serve to explain the principles of the invention.

DETAILED DESCRIPTION OF THE PREFERRED EMBODIMENTS

Reference will now be made in detail to the present preferred embodiments of the flexural transducer according to this invention. Generally, the flexural electromechanical transducer comprises at least one constant-modulus alloy plate; a piezoelectric ceramic plate mechanically coupled to the constant-modulus alloy plate and having a residual polarization in one direction and surfaces parallel to the polarization direction; and lead means electrically connected to the piezoelectric ceramic plate surfaces parallel to the polarization direction for applying a specified frequency signal to the parallel surfaces and obtaining a thickness-shear vibration mode of the piezoelectric ceramic plate and flexural vibration of the transducer.

Figure 4:
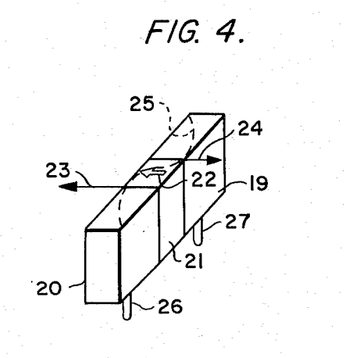
FIG. 4 is a prospective view of a first preferred embodiment of a flexural bar-type transducer according to the invention.

In a first preferred embodiment, as illustrated in FIG. 4, this flexural transducer has a flexural bar-type configuration. The transducer comprises two metal plates 19 and 20 formed of a constant-modulus alloy material with a piezoelectric ceramic plate 21 positioned between and mechanically coupled at its electrode surfaces to the metal plates 19 and 20 by suitable bonding means, such as soldering or using a commercially available bonding agent. In this embodiment, the plate 21 is positioned at the center of the transducer in the longitudinal direction and the lengths of the plates 19 and 20 are substantially equal. The piezoelectric ceramic plate has a residual polarization direction, as indicated by arrow 22 shown in FIG. 4, which is perpendicular to the longitudinal direction of the plates 19 and 20 and the transducer. Wires 26 and 27 are electrically connected respectively to the metal plates 19 and 20 to perform a dual function of supporting and lead wires. To achieve this dual function, the supporting and lead wires 26 and 27 are connected to the plates 19 and 20 at flexural vibration nodes, i.e., the location where vibration displacement is zero, as best shown by the dotted line 25.

Due to the configuration of the transducer, when an AC voltage having a specified frequency signal is applied to the supporting and lead wires 26 and 27 of the respective metal plates 19 and 20, the piezoelectric ceramic plate 21, with electrode surfaces coupled to the metal plates 19 and 20, exhibits a "thickness-shear" vibration in a direction indicated by the arrows 23 and 24. This thickness-shear vibration of the ceramic plate 21 in turn causes the flexural vibration of the transducer as indicated by the dotted line 25.

Figure 5:
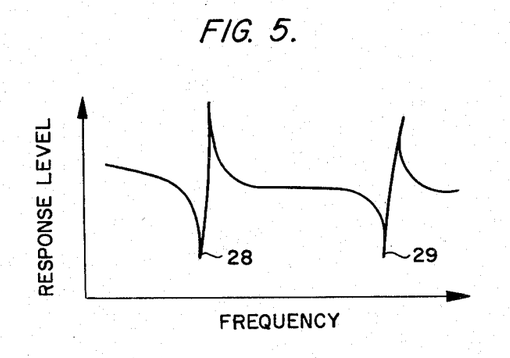
FIG. 5 depicts the frequency response characteristics of the flexural transducer of FIG. 4.

The frequency response characteristics of the transducer of FIG. 4 are illustrated in FIG. 5, wherein the axis of abscissas represents frequency while the axis of ordinates represents response level or attenuation. Reference numeral 28 represents the resonant point of the second order flexural vibration while reference numeral 29 represents the resonant point of the fourth order flexural vibration. While FIG. 5 does not illustrate further resonant points for this transducer, resonance of even order vibration, such as the sixth and eighth orders, appear at frequencies higher than the resonant point of the fourth order flexural vibration shown at the right side of FIG. 5. Only even order vibrations occur in this embodiment of the transducer because of the center position of the piezoelectric ceramic plate 21 and the substantially equal lengths of the two alloy plates 19 and 20. However, resonant points of both even and odd orders, i.e., all vibrational modes, may be provided in a flexural transducer according to the invention as will be described hereinafter.

Figure 6:
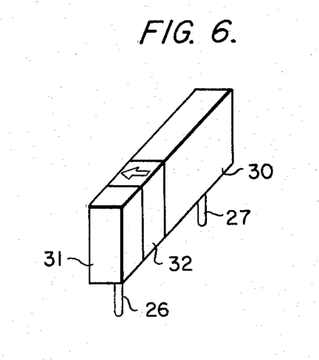
FIG. 6 is a perspective view of a modified embodiment of the flexural bar-type transducer of FIG. 4 according to the invention.

FIG. 6 illustrates a modified embodiment of the flexural bar-type transducer of FIG. 4 to provide different frequency response characteristics. This modified transducer employs the same principles and substantially the same configuration as that of FIG. 4. Supporting lead wires 26 and 27 are coupled respectively to two metal plates 30 and 31 at flexural vibration nodes. A piezoelectric ceramic plate 32 is positioned between and coupled to the plates 30 and 31 and again has a residual polarization in a direction which is perpendicular to the longitudinal direction of the metal plates 30 and 31 and the transducer. When an AC voltage is applied to the supporting and lead wires 26 and 27, the ceramic plate 32 again exhibits a thickness-shear vibration which in turn causes the flexural vibration of the transducer. In this modified embodiment, however, the piezoelectric ceramic plate 32 is located away from the center of the transducer in the longitudinal direction with the metal plates 30 and 31 having different lengths to create different frequency response characteristics.

Figure 7:
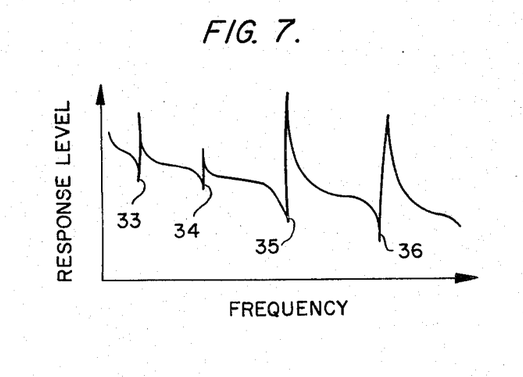
FIG. 7 depicts the frequency response characteristics of the flexural transducer of FIG. 6.

The frequency response characteristics of the modified transducer of FIG. 6 are illustrated in FIG. 7, wherein the axis of abscissas represents frequency while the axis of ordinates represents response level. As can be seen, odd and even orders of flexural vibrations occur in this transducer, with reference numerals 33, 34, 35 and 36 representing respectively the resonant points of the first order, second order, third order, and fourth order flexural vibrations. Odd and even resonant points higher than the fourth order occur, but are not illustrated.

Structural differences and the improved results of a flexural bar-type transducer according to this invention (FIGS. 4-7) over the conventional transducers (FIGS. 2 and 3) are now evident.

In the transducer embodiments of FIGS. 4 and 6, the constant-modulus plates and piezoelectric ceramic plate are coupled in series in a longitudinal direction of the transducer. In contrast to the conventional transducer shown in FIG. 3, however, the flexural bar-type transducers according to the present invention require only one piezoelectric ceramic plate, not two piezoelectric ceramic plates arranged in parallel and having residual polarizations opposite to each other. Accordingly, the transducer of the present invention has a simplified structure and is easily fabricated. Secondly, the transducers shown in FIGS. 4 and 6 do not require separate lead wires such as shown in the conventional transducers of FIGS. 2 and 3. That is, the wire connected to the constant-modulus alloy plates at the flexural vibration nodes functions both as a supporting and lead wire. Finally, the transducers according to the present invention achieve a "thickness-shear" vibration of the piezoelectric ceramic plate. This vibrational mode results in a substantially larger electromechanical coupling coefficient than the conventional transducers which employ either "extension and compression" or "thickness-extensional" vibration of the piezoelectric ceramic plates.

Because of the above operational differences, the transducer according to the present invention has a lower capacitance ratio r than that of the conventional transducers. Use of such a transducer in a mechanical filter provides a wide frequency characteristic or band width without the use of an additional electrical circuit of L and C elements. Secondly, the transducer of this invention has a high quality factor Q which approaches 3,000, in spite of the lower capacitance ratio r. In contrast, the quality factor Q of a langevin-type torsional vibration transducer having the same capacitance ratio as the transducer of the present invention is approximately 300. Finally, a mechanical filter employing a transducer of the present invention has excellent spurious characteristics. As is shown in FIGS. 5 and 7, the transducer shows little vibration other than the flexural vibration that is desired. In the transducer of FIG. 4 where the piezoelectric ceramic plate is positioned in the center of the longitudinal direction of the transducer, only an even order flexural vibrational mode is achieved. It can be seen, therefore, that resonance of flexural modes adjacent to the resonance of desired flexural vibration modes can be isolated as shown in FIG. 5 in the transducer of this invention.

Figure 8:
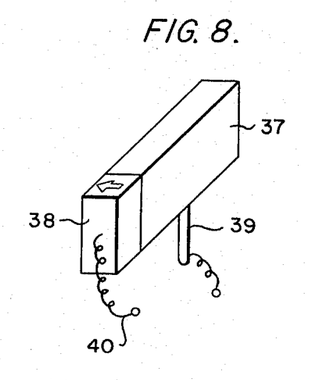
FIG. 8 is yet another modified embodiment of the flexural bar-type transducer of FIG. 4 according to the invention.

Referring to FIG. 8, there will now be described yet another modified embodiment of the flexural bar-type transducer of FIG. 4 according to the invention. This flexural bar-type transducer employs the same principles as the transducer shown in FIG. 4. That is, a piezoelectric plate 38 has a residual polarization in a direction perpendicular to the longitudinal direction of the transducer. In contrast to the transducer shown in FIGS. 4 and 6, however, this modified transducer has only one constant-modulus alloy plate 37 and eliminates the second alloy plate. The alloy plate 37 is coupled at one end to an electrode surface of the ceramic plate 38 parallel to the residual polarization direction of the plate 38. A wire 39 is connected to the one alloy plate 37 at a flexural vibration node to provide a dual function as both a supporting and lead wire. A lead wire 40 is connected to the exposed electrode surface of the ceramic plate 38 opposite to the surface coupled to the alloy plate 37. Again, a thickness-shear vibration mode of the ceramic plate is achieved, which in turn causes the flexural vibration of the transducer. While the modified transducer shown in FIG. 8 achieves substantially the same improved results as the preferred embodiments of the transducer shown in FIGS. 4 and 6, this modification eliminates one alloy plate, thus requiring fewer elements. Accordingly, both the structure of the transducer and the fabrication process is simplified and costs are reduced.

Figure 9:
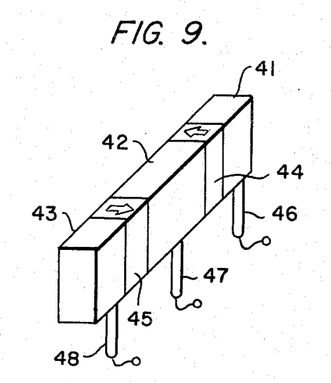
FIG. 9 is still a further modified embodiment of the flexural bar-type transducer of FIG. 4 according to the invention.

FIG. 9 illustrates still a further modified embodiment of the flexural bar-type transducer shown in FIG. 4. This transducer comprises three constant-modulus alloy plates 41, 42 and 43 and two piezoelectric ceramic plates 44 and 45. The piezoelectric ceramic plate 44 is positioned between and mechanically coupled to the constant-modulus alloy plates 41 and 42, while the piezoelectric ceramic plate 45 is positioned between and mechanically coupled to the constant-modulus alloy plates 42 and 43. The ceramic plates 44 and 45 have opposite residual polarizations to each other in a direction perpendicular to the longitudinal direction of the alloy plates and the transducer. As herein embodied, the alloy plates 41, 42 and 43 are coupled to the electrode surfaces of the ceramic plates 44 and 45 parallel to the residual polarization direction of the ceramic plates to form the flexural bar-type configuration of the transducer. The transducer further comprises wires 46, 47 and 48 which are respectively connected to the alloy plates 41, 42 and 43 at flexural vibration nodes to perform the dual function of supporting and lead wires.

When the supporting and lead wires 46 and 48 are connected together electrically, and an electrical signal is applied across the common terminal and the other terminal 47, the transducer operates in a manner similar to the transducers shown in FIGS. 4, 6 and 8. However, when an AC voltage of a specified frequency is applied across the supporting and lead wires 46 and 47, the flexural vibration created in the transducer is transferred through mechanical-electro conversion by the piezoelectric ceramic plate 45 into an output electrical signal from the terminals 48 and 47. Because of this unique operation, this one transducer can be used as a band pass filter.

Figure 10:
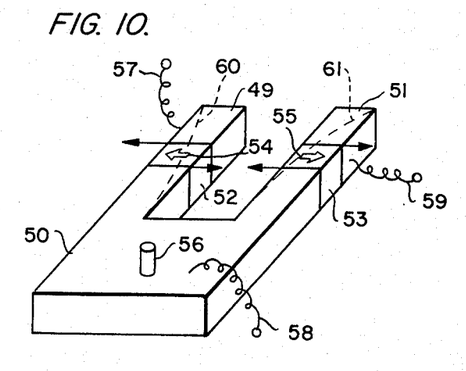
FIG. 10 is a perspective view of a flexural tuning fork-type transducer according to the invention employing the principles of the transducer of FIG. 4.

FIG. 10 illustrates a flexural tuning fork-type transducer according to the invention which employs the principles of the transducer shown in FIG. 4. The tuning fork-type flexural transducer is highly desirable in many commercial applications, such as mechanical filters for low frequency ranges, because it can be operated at a lower frequency and can be reduced in size compared to the flexural bar-type transducer. As herein embodied, the tuning fork-type transducer of FIG. 10 includes three constant-modulus alloy plates 49, 50 and 51 with one plate 50 being formed with two arms. Two piezoelectric ceramic plates 52 and 53 are employed, with plate 52 positioned between and mechanically coupled to alloy plate 49 and the left arm of alloy plate 50 while plate 53 is positioned between and mechanically coupled to the alloy plate 51 and the right arm of the alloy plate 50. The residual polarizations of the piezoelectric ceramic plates, as shown by arrows 54 and 55, are opposed to each other and in a direction perpendicular to the longitudinal direction of the transducer. The alloy plates 49, 50 and 51 are coupled to the electrode surfaces of the respective ceramic plates 52 and 53 parallel to the residual polarization direction to provide a thickness-shear vibrational mode to the ceramic plates. The transducer further includes lead wires 57, 58 and 59 respectively connected to the alloy plates 49, 51 and 50. Reference numeral represents a supporting wire.

When an AC voltage of a specified frequency is applied across the lead wires 57 and 58, the transducer exhibits symmetrical vibrations in a mode shown by the dotted lines 60 and 61. This flexural vibration is transformed through mechanical-electro conversion by the piezoelectric ceramic plate 53 into an electrical output signal from the lead wires 58 and 59. Therefore, like the transducer of FIG. 9, this one transducer can be used as a bandpass filter. When the terminals 57 and 59 are electrically coupled together, and an electrical signal is applied across this common terminal and the lead wire 58, the transducer operates in a manner similar to that shown for the transducers of FIGS. 4, 6 and 8.

Figure 11:
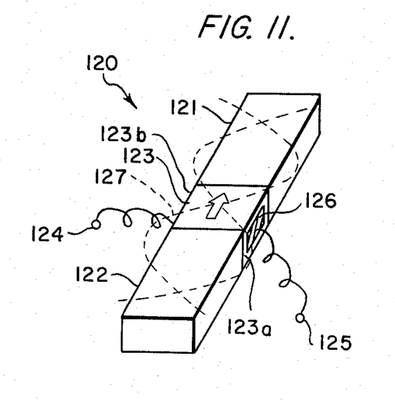
FIG. 11 is a second preferred embodiment of a flexural bar-type transducer according to the invention.

Another preferred embodiment of a flexural bar-type transducer according to the present invention is illustrated in FIG. 11. The transducer 120 has a bar-type configuration similar to the transducer of FIG. 4. It comprises two plates 121 and 122 of substantially equal length consisting of a constant-modulus alloy material, such as a nickel and iron alloy sold under the brand name of "Elinbar". A piezoelectric ceramic plate 123 is positioned between and mechanically coupled to the alloy plates 121 and 122 in the center of the transducer in the longitudinal direction by suitable bonding means, such as soldering or using a commercially available bonding agent.

In the embodiment of the transducer of FIG. 11 and in contrast to the previously described transducers, the piezoelectric ceramic plate 123 has a residual polarization direction, as indicated by the arrow shown in FIG. 11, which coincides with the longitudinal direction of the flexural transducer 120. To apply a voltage signal to the transducer 120, input terminals 124 and 125 are provided. In order to vibrate the ceramic plate 123 when a voltage signal is applied to terminals 124 and 125, the transducer 120 includes thin electrodes 126 and 127 formed on opposite exposed vertical surfaces of the ceramic plate 123 parallel to the residual polarization direction of the plate 123. These thin electrodes 126 and 127 can be formed on the surfaces of the plate 123 by suitable means, such as evaporation.

With the above configuration of the transducer 120, when an AC voltage of a specified frequency is applied across the input terminals 124 and 125, the piezoelectric ceramic plate exhibits a thickness-shear vibration to cause the flexural vibration mode of the transducer as shown by the dotted lines in FIG. 11.

Figure 12:
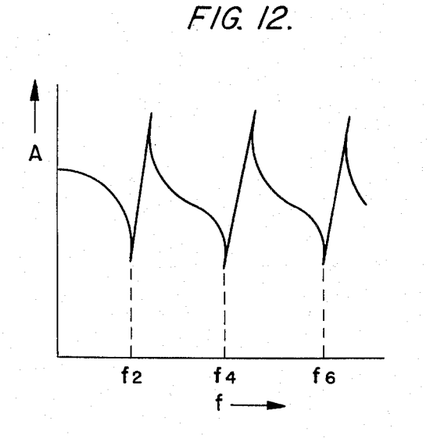
FIG. 12 depicts the frequency response characteristics of the flexural transducer of FIG. 11.

The frequency response characteristics of the transducer of FIG. 11 are illustrated in FIG. 12, wherein the axis of abscissas represents frequency while the axis of ordinates represents response level or attenuation A. As can be seen, the flexural transducer 120 achieves an even order vibrational mode, principally because of the center location of the piezoelectric ceramic plate 123 and the substantially equal lengths of the two alloy plates 121 and 122. However, resonant points of even and odd orders may be provided in a transducer of this type according to the invention as will be described hereinafter.

Figure 13:
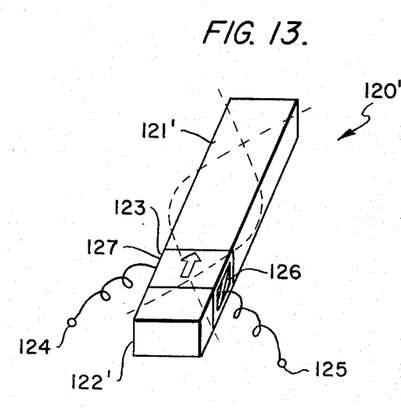
FIG. 13 is a modified embodiment of the flexural bar-type transducer of FIG. 11 according to the invention.

FIG. 13 illustrates a modified embodiment of the flexural bar-type transducer of FIG. 11 to provide different frequency response characteristics. This modified transducer 120' employs the same principles and substantially the same configuration as transducer 120. Thin electrodes 126 and 127 are again formed on the opposite exposed vertical surfaces of the ceramic plate 123 parallel to the residual polarization of the plate 123. The piezoelectric ceramic plate 123 has a residual polarization in a direction which coincides with the longitudinal direction of the transducer. When an AC voltage is applied to the electrodes 126 and 127, the ceramic plate 123 exhibits a thickness-shear vibration which in turn causes the flexural vibration of the transducer, as shown by the dotted line in FIG. 13. In transducer 120', however, the piezoelectric ceramic plate 123 is located away from the center of the transducer in a longitudinal direction with metal plates 121' and 122' having different lengths to create different frequency characteristics.

Figure 14:
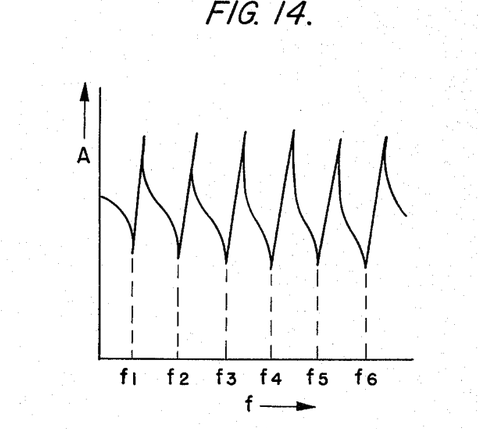
FIG. 14 depicts the frequency response characteristics of the flexural transducer of FIG. 13.

The frequency response characteristics of the modified transducer 120' shown in FIG. 13 are illustrated in FIG. 14, wherein the axis of abscissas represents frequency and the axis of ordinates represents response level or attenuation A. As can be seen, both odd and even orders of flexural vibrations occur in this transducer, with odd and even resonant points higher than the sixth order occurring but not illustrated.

Figure 15:
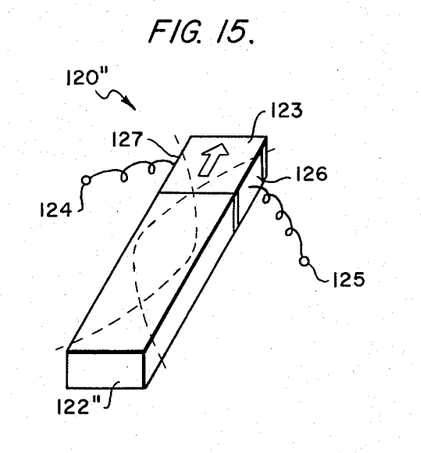
FIG. 15 is a further modified embodiment of the flexural bar-type transducer of FIG. 11 according to the invention.

Referring to FIG. 15, there will now be described yet another modified embodiment of the flexural bar-type transducer of FIG. 11 according to the invention. This flexural bar-type transducer 120" employs the same principles as the transducer of FIG. 11. That is, the piezoelectric plate 123 has a residual polarization in a direction which coincides to the longitudinal direction of the transducer. This electrodes 126 and 127 are formed on opposite exposed surfaces of the ceramic plate 123 parallel to the residual polarization direction of the ceramic plate. Again, a thickness-shear vibration mode of the ceramic plate 123 is achieved during operation of the transducer which in turn results in the flexural vibration of the transducer, as indicated by the dotted line in FIG. 15, in every order of vibration. In contrast to the transducer of FIG. 11, however, the transducer 120″ has only one constant-modulus alloy plate 122″ and eliminates the second alloy plate. The alloy plate 122″ is coupled at one end to the ceramic plate perpendicular to the residual polarization direction of the ceramic plate to form the flexural bar-type configuration of the transducer. While the modified transducer of FIG. 15 achieves substantially the same improved results as the transducer shown in FIGS. 11 and 13, this modification eliminates one alloy plate, thus requiring fewer elements. Accordingly, both the overall structure of the transducer 120″ and the fabrication process is simplified and costs are reduced.

The flexural bar-type transducers of this invention shown in FIGS. 11, 13 and 15 have significant structural differences and resulting improvements over the conventional transducers. In the transducer embodiments of FIGS. 11, 13 and 15, the constant-modulus alloy plates and piezoelectric ceramic plate are coupled in series in a longitudinal direction. In contrast to the conventional transducer shown in FIG. 3, however, the transducers 120, 120′ and 120″ require only one piezoelectric ceramic plate, not two piezoelectric ceramic plates arranged in parallel and having residual polarization directions opposite to each other. Accordingly, the transducer of the present invention has a simplified structure and is easily fabricated. Secondly, the transducers shown in FIGS. 11, 13 and 15 use thin electrodes for generating the flexural vibration of the transducer which are provided at opposite exposed vertical surfaces of the piezoelectric ceramic plate parallel to the longitudinal and vibrating direction of the transducer. This arrangement allows for easy correction of equivalent constants to a specified value determined for the transducer simply by changing the surface area of the thin electrodes. This allows the transducer to have a very homogeneous quality with excellent yield, and great versatility. Finally, the transducers 120, 120′ and 120″ according to the present invention continue to achieve a "thickness-shear" vibration of the piezoelectric ceramic plate. This vibrational mode results in a substantially larger electromechanical coupling coefficient than the conventional transducers which employ either "extension and compression" or "thickness-extensional" vibration of the piezoelectric ceramic plates.

Because of the above operational differences, the transducer according to the present invention has a lower capacitance ratio r than that of the conventional transducers. Use of such a transducer in a mechanical filter provides a wide frequency characteristic or band width without the use of an additional electrical circuit. Secondly, the transducer achieves a high quality factor Q despite the lower capacitance ratio r. Finally, a mechanical filter using the transducer of this invention exhibits excellent spurious characteristics because the transducer shows little vibration other than the desired flexural vibration.

Figure 16:
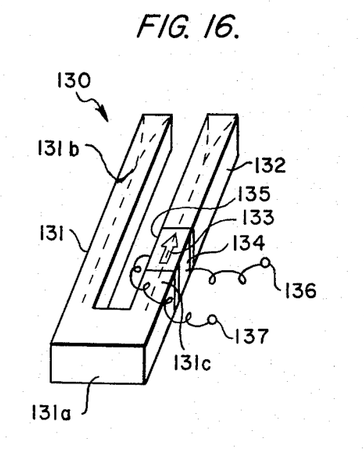
FIG. 16 is a perspective view of a flexural tuning fork-type transducer according to the invention employing the principles of the flexural transducer of FIG. 11.

FIG. 16 illustrates a flexural tuning fork-type transducer according to the invention which employs the principles of the transducer shown in FIG. 11. As previously mentioned, the tuning fork-type flexural transducer is highly desirable in many commercial applications because it can be operated at a lower frequency and can be reduced in size compared to the bar-type transducer. As herein embodied, the transducer 130 includes two constant-modulus alloy plates 131 and 132 with one of the plates being formed in a tuning fork configuration comprising an arm segment 131b, a shorter arm segment 131c arranged in parallel with the arm 131b, and a connecting base 131a. The second alloy plate 132 forms with segment 131c the right arm of the tuning fork. However, a piezoelectric ceramic plate 133 is positioned between and mechanically coupled to the alloy plate 132 and the arm segment 131c. Alloy plates 131 and 132 may be coupled to the ceramic plate 133 by suitable bonding means, such as soldering or using a commercially available bonding agent. The piezoelectric ceramic plate 133 has a residual polarization direction, as indicated by an arrow shown in FIG. 16, which coincides with the longitudinal direction of the flexural transducer 130 along the arm segment 131c and alloy plate 132. Together, the alloy plates 131, 132, and the ceramic plate 133, form the tuning fork flexural transducer.

To apply a voltage signal to transducer 130, input terminals 136 and 137 are provided. In order to actuate the ceramic plate 133 when a signal is applied to the input terminals, the transducer 130 includes thin electrodes 134 and 135 connected respectively to the input terminals 136 and 137 and which are formed on opposite exposed vertical surfaces of the ceramic plate 133 parallel to the residual polarization direction of the ceramic plate. As previously mentioned, the thin electrodes 134 and 135 can be formed on the surfaces of the plate 133 by suitable means such as evaporation. When an AC voltage of a specified frequency is applied across the input terminals 136 and 137, the piezoelectric ceramic plate exhibits a thickness-shear vibration to cause the flexural vibration mode of the transducer as shown by the dotted line in FIG. 16.

Figure 17:
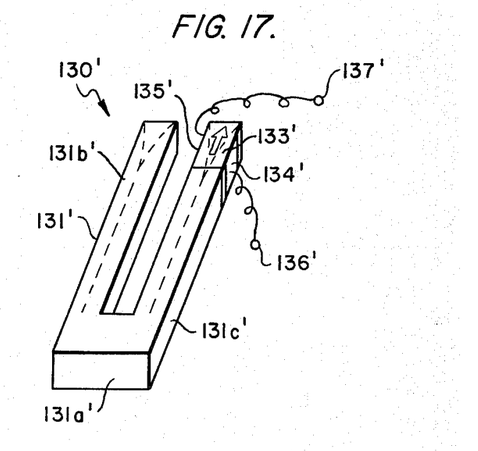
FIG. 17 is a perspective view of another flexural tuning fork-type transducer according to the invention employing the principles of the flexural transducer of FIG. 11.

Referring to FIG. 17, there will now be described a modified embodiment of the transducer shown in FIG. 16, with the same elements being given the same reference numerals except for the addition of the mark ('). The transducer 130′ employs the same principles as the transducer 130. That is, the piezoelectric plate 133′ has a residual polarization in a direction which coincides to the longitudinal direction of the transducer. Thin electrodes 134′ and 135′ are formed on opposite exposed vertical surfaces of the ceramic plate 133′ parallel to the residual polarization direction of the ceramic plate. Again, a thickness-shear vibration mode of the ceramic plate 133′ is achieved during operation of the transducer which in turn results in the flexural vibration of the transducer, as indicated by the dotted line in FIG. 17. In contrast to the transducer 130, however, the transducer 130′ has only one constant-modulus alloy plate 131′ and eliminates the second alloy plate. It can be seen that the tuning fork-type transducer 130′ differs in that the arm segment 131c′ of the arm 131′ is longer and the piezoelectric ceramic plate 133′ is provided at the end of that arm segment 131c′ to form the tuning fork configuration. While the modified transducer 130′ achieves substantially the same improved results as the transducer 130, this modification eliminates one alloy plate, thus requiring fewer elements. Accordingly, both the structure of the transducer 130' and the fabrication process are simplified and costs are reduced.

The tuning fork-type flexural transducers shown in FIGS. 16 and 17 have advantages over the conventional transducers similar to the flexible bar-type transducers shown in FIGS. 11, 13 and 15. While only one piezoelectric ceramic plate is used in the above embodiments of FIGS. 11, 13 and 15-17, it is of course possible to employ a plurality of piezoelectric ceramic plates and a plurality of constant-modulus alloy plates cascaded in a manner similar to the transducers shown in FIGS. 9 and 10 to achieve different frequency characteristics and to allow the one transducer to be used as a band pass filter.

Figure 18:
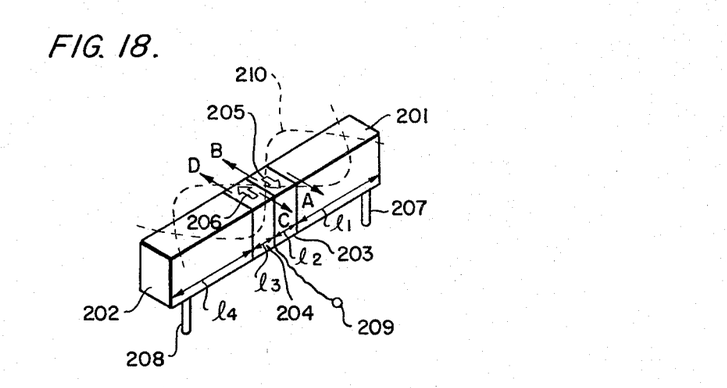
FIG. 18 is a perspective view of a third preferred embodiment of a flexural bar-type transducer according to the invention.

Still another preferred embodiment of a flexural bar-type transducer according to the present invention is illustrated in FIG. 18. This transducer embodiment achieves a high quality factor Q with a low capacitance ratio r. A mechanical filter employing the transducer has a low impedance characteristic. As herein embodied, the transducer comprises two metal plates 201 and 202 consisting of a constant-modulus alloy material and two piezoelectric ceramic plates 203 and 204. The piezoelectric ceramic plates 203 and 204 are positioned between and mechanically coupled at electrode surfaces to the alloy plates 201 and 202 by suitable bonding means described previously. The ceramic plates have opposite residual polarizations to each other in a direction perpendicular to the longitudinal direction of the transducer, as indicated by arrows 205 and 206. In this embodiment, the plates 203 and 204 are positioned at the center of the transducer in the longitudinal direction and the lengths of the plates 201 and 202 are substantially equal. Wires 207 and 208 are electrically connected respectively to the alloy plates 201 and 202 to perform a dual function of supporting and lead wires. To achieve this dual function, the supporting and lead wires 207 and 208 are connected to the alloy plates 201 and 202 at flexural vibration nodes, i.e., the location where vibration displacement is zero, as best shown by the dotted line 210. A third wire 209 is electrically and commonly connected to the piezoelectric ceramic plates 203 and 204.

Due to the configuration of the transducer, when the wires 207 and 208 are commonly connected thus forming one terminal and an AC voltage having a specified frequency signal is supplied to this common terminal and the other lead wire 209, the piezoelectric ceramic plates 203 and 205 exhibit a thickness-shear vibration in the directions indicated respectively by arrows A and B, and C and D. The thickness-shear vibrations of the plates 203 and 204 in turn cause the flexural vibration of the transducer shown by the dotted line 210.

Figure 19:
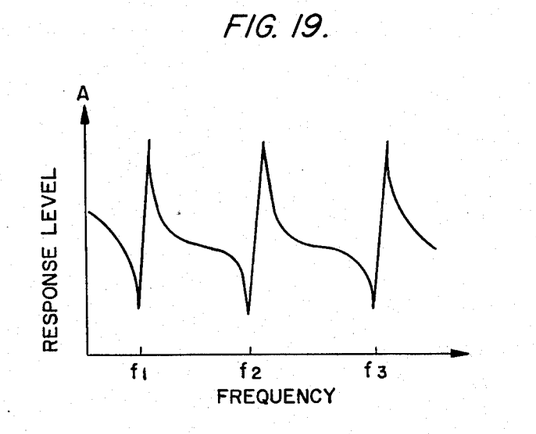
FIG. 19 illustrates the frequency response characteristics of the flexural transducer of FIG. 18.

The frequency response characteristics of the transducer of FIG. 18 are illustrated in FIG. 19, wherein the axis of abscissas represents frequency while the axis of ordinates represents response level or attenuation. As can be seen, the flexural transducer vibrates only in an even order vibrational mode because of the center position of the two piezoelectric ceramic plates 203 and 204 and the substantially equal lengths of the two alloy plates 201 and 202. However, resonant points of even and odd orders may be provided in a transducer of this type according to the invention if the piezoelectric ceramic plates 203 and 204 are located away from the center of the transducer in the longitudinal direction and the alloy plates 201 and 202 have different lengths.

Figure 20:
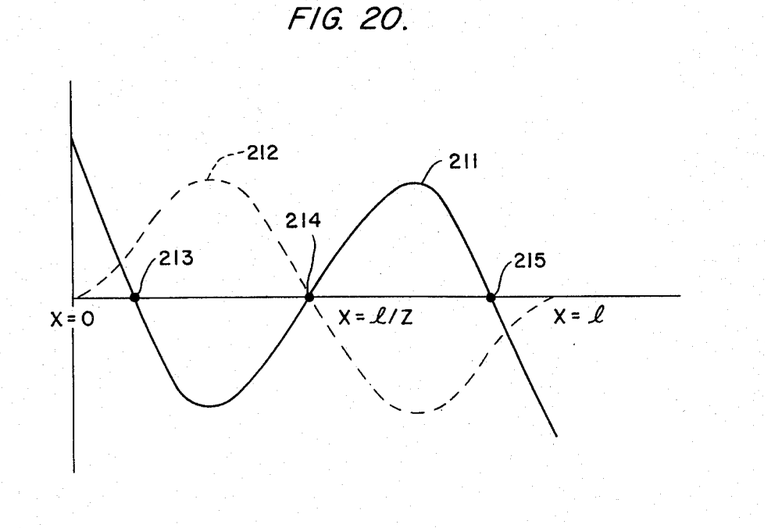
FIG. 20 illustrates the vibration displacement and bending moment of the flexural transducer of FIG. 18.

Referring now to FIG. 20, there is illustrated the distribution of the vibrational displacement and the bending moment of the transducer of FIG. 18, wherein the length of the metal plates 201 and 202 are the same, i.e., $l_1 = l_4$, and the lengths of the piezoelectric ceramic plates 203 and 204 are the same, i.e., $l_2 = l_3$. The axis of abscissas of FIG. 20 represents the length of the transducer, while the axis of ordinates represents the distribution level. Reference numeral 211 identifies the vibration displacement distribution while reference numeral 212 identifies the bending moment distribution. Reference numerals 213, 214 and 215 represent nodes, that is, the location where the vibration displacement is zero. The connecting locations for the supporting and lead wires 207 and 208 of the transducer in FIG. 18 correspond to the nodes 213 and 215 identified in FIG. 20.

The flexural transducer of FIG. 18 demonstrates the same excellent performance as that previously described, i.e., a high quality factor Q, low impedance characteristics, and good spurious characteristics. Despite these improvements, several potential problems exist in the transducer of FIG. 18. Firstly, there may be some degree of difficulty in extracting a common lead wire 209 from between the two piezoelectric ceramic plates 203 and 204. Accordingly, a potential fabrication and use reliability problem may occur. Secondly, as can be seen from FIG. 20, the bending moment of the transducer does not necessarily become zero when the vibration displacement, or flexural vibration nodes, become zero. Since the supporting and lead wires 207 and 206 which are connected to the flexural vibration nodes normally have a limited thickness, a spurious torsional vibration may be generated. This spurious vibration may have a potential adverse effect on the filter characteristics of the transducer.

Figure 21:
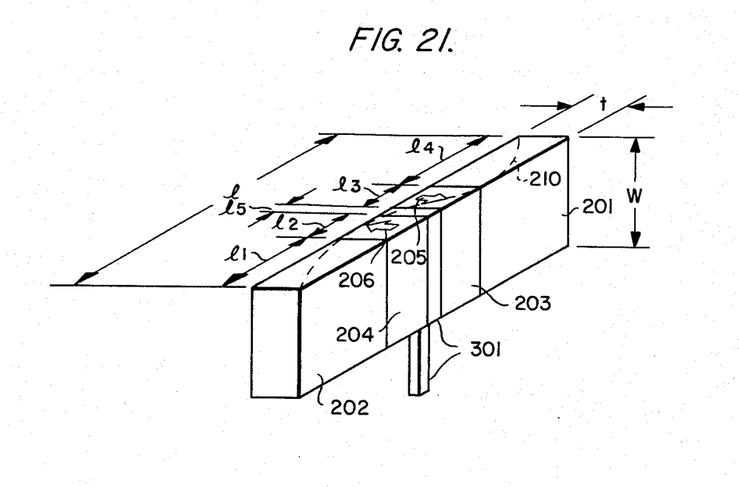
FIG. 21 is a modified embodiment of the flexural bar-type transducer of FIG. 18 according to the invention.

To overcome the above difficulties while maintaining the high performance achieved by the transducer of FIG. 18, a modified embodiment of the transducer, as illustrated in FIG. 21, will now be described. This modified transducer employs the same principles as those of the transducer of FIG. 18. Accordingly, the elements of the transducer of FIG. 21 corresponding to the same elements of the transducer of FIG. 18 are identified with the same reference numerals. Namely, elements 201 through 206 and 210 remain substantially the same. In this modified embodiment, however, the transducer has a support and electrode metal plate 301 which replaces the lead wire 209. This support and electrode plate 301 plays a dual role of supporting the transducer and providing the common electrode between the ceramic plates 203 and 204. The plate 301 is positioned between and mechanically coupled to piezoelectric ceramic plates 203 and 204.

Figure 22:
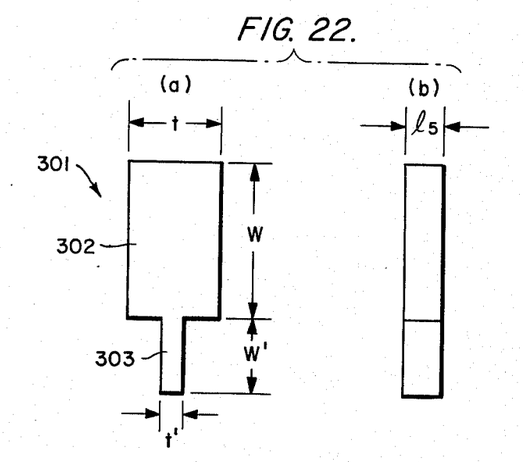
FIG. 22 is a plan view of the supporting and electrode plate employed in the flexural transducer of FIG. 21.

FIG. 22 is an enlarged view of the support and lead plate 301. More specifically, FIG. 22(a) illustrates that the plate 301 comprises a first portion 302 which is positioned between and mechanically coupled to the two ceramic plates 203 and 204 and which has a cross-section ($t \times w$) substantially equal to the cross-section of the surfaces of the piezoelectric ceramic plates 203 and 204 to which it is coupled. Portion 302 acts as the electrode. The plate 301 further includes a second portion 303 which extends out from between the ceramic plates 203 and 204 to act as a support for the transducer and which has a cross-section ($t' \times w'$) smaller than that of the electrode portion 302. As shown in FIG. 21, the plate 301 is positioned substantially in the center of the transducer in the longitudinal direction. FIG. 22(b) depicts the length $l_5$ of the plate 301 in the longitudinal direction of the transducer.

It can be seen from the foregoing that the transducer of FIG. 21 overcomes the potential problems of the transducer of FIG. 18. First, the lead wire which is extracted from between the two piezoelectric ceramic plates can be eliminated, thus making fabrication simpler and improving reliability. Secondly, the two heavier wires 207 and 208 acting as both support and lead wires previously necessary can be eliminated by use of the plate 301 acting in the dual role of a support as well as an electrode plate. Only two thin wires and a single lead wire need be connected to the alloy plates 201 and 202. When the supporting and electrode plate is arranged at the center of the transducer in the longitudinal direction, the vibration displacement and bending moment of the transducer at that location become zero. Accordingly, any spurious effect due to torsional vibration through the previous support wires of the alloy plates 201 and 202 can be eliminated. When an AC voltage of a specified frequency is applied across the single lead wire connected to the metal plates and the supporting plate 301, the piezoelectric ceramic plates 203 and 204 vibrate in a thickness-shear vibrational mode. This in turn causes the flexural vibration of the transducer.

Figure 23:
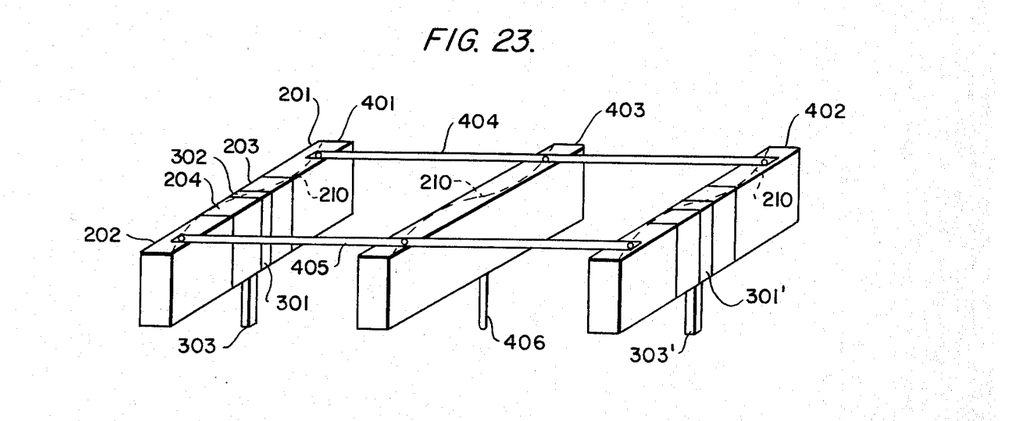
FIG. 23 is a perspective view of a mechanical filter incorporating the flexural transducer of FIG. 21.

The flexural transducer of FIG. 21 has particular adaptation and advantages for use in a mechanical filter having at least one mechanical resonator, lead means for applying a specified frequency signal to the resonator, and at least two mechanical couplers connected to the mechanical resonator and to the transducer. A mechanical filter employing such flexural transducers shown in FIG. 21 is illustrated in FIG. 23. Reference numerals 401 and 402 identify the flexural transducers and the elements of those transducers are identified with the same reference numerals as in FIG. 21. As embodied in the mechanical filter, the flexural transducer 401 is used as an input transducer for converting an input electrical signal into a mechanical signal, while transducer 402 is used as an output transducer for converting the mechanical signal into an output electrical signal. The mechanical filter further includes a mechanical flexural resonator 403 and mechanical coupling elements 404 and 405. The mechanical coupler 404 is connected to the resonator 403 and the alloy plate 201 of the transducer 401, while the mechanical coupler 405 is connected to the resonator 403 and the alloy plate 202 of the transducer 401 and 402. The wire 406 connected to the resonator 403 has a dual function of a supporting and lead wire.

When an AC voltage of a specified frequency is applied to the supporting and lead wire 406 of the resonator 403 and the supporting and electrode plate 301 of the input transducer 401, the transducer 401 is driven by a desired frequency. It can be seen that the two alloy plates 201 and 202 of the transducer 401 are at the same potential by being coupled through mechanical couplers 404 and 405 to the resonator 403. Accordingly, the piezoelectric ceramic plates 203 and 204 exhibit "thickness-shear" vibrations, which in turn causes the flexural vibration of the transducer as indicated by the dotted line 210 shown in FIG. 23. In a similar fashion, the supporting portion 303' of the plate 301' and the supporting and lead wire 406 for the resonator become output terminals for a filtered electrical signal extracted by the mechanical filter.

It can thus be seen that in the mechanical filter of FIG. 23, lead wires connected to the alloy plates of the transducer which were previously necessary and the common lead wire to the two ceramic plates 203 and 204 of the flexural transducer are eliminated. Since there is also no further need for a supporting wire connected to the alloy plates of the transducer, there is no restriction on the location for connecting the mechanical coupling elements to the transducers. In the embodiment of the mechanical filter shown in FIG. 23, the two mechanical couplers 404 and 405 are connected on the same surface of the transducers 401 and 402. However, when the transducers are adapted to a pole-type filter in the attenuation band, it is usually necessary to connect more than two mechanical couplers to the transducers. It would be difficult to connect all of the couplers to only one surface of the transducer. Accordingly, both upper and lower surfaces of the alloy plates of the transducer would be used. If supporting and/or wires had to be connected to the alloy plates of the transducer, such wires would become a major obstacle in the design and fabrication of the mechanical filter. The transducer shown in FIG. 21 for a mechanical filter is capable of eliminating the above difficulties.

As can be seen from the above description of the embodiments of the flexural transducer according to the present invention, significant improvements are made in the transducer and filter art. Such advantages include a high electromechanical coefficient, a low capacitance ratio r, a high quality factor Q, and low spurious characteristics in a flexural transducer. The preferred embodiment of the flexural transducers of FIGS. 18 and 21 have particularly low impedance characteristics. In summary, manufacture, quality, structure size, and reliability of a flexural transducer made in accordance with this invention are significantly improved compared to the conventional filters. These improvements give the transducer new industrial applications, including those in mechanical filters and more particularly channel translating and carrier transmission equipment.

It will be apparent to those skilled in the art that various modifications and variations could be made in the flexural transducer of the invention without departing from the spirit or scope of the invention. For example, while several preferred embodiments of the flexural transducer are illustrated for obtaining an even order flexural vibration mode, transducers applying the principles of this invention can achieve any desired order of flexural vibration. Thus, it is intended that present invention cover the modifications and variations of this invention falling within the scope of the appended claims and their equivalents.

What is claimed is:

1. A flexural electromechanical transducer of elongated configuration comprising:
   (a) at least one constant-modulus alloy plate;
   (b) a piezoelectric ceramic plate mechanically coupled to said at least one constant-modulus alloy plate and having a residual polarization in one direction and surfaces parallel to the polarization direction; and
   (c) lead means electrically connected to said piezoelectric ceramic plate surfaces parallel to the polarization direction for applying a specified frequency signal to said parallel surfaces and obtaining a thickness-shear vibration mode of said piezoelectric ceramic plate and flexural vibration of said transducer.

2. The flexural transducer of claim 1, wherein the residual polarization direction of said piezoelectric ceramic plate is perpendicular to the longitudinal direction of the transducer and said lead means includes a supporting and lead wire connected to said at least one constant-modulus alloy plate at a flexural vibration node.

3. The flexural transducer of claim 1, wherein said at least one alloy plate comprises first and second constant-modulus alloy plates coupled to opposite surfaces of said piezoelectric ceramic plate and wherein said lead means comprises first and second supporting and lead wires respectively connected to said first and second constant-modulus alloy plates at flexural vibration nodes.

4. The flexural transducer of claim 3 wherein the residual polarization direction of said piezoelectric ceramic plate is perpendicular to the lengths of said alloy plates in the longitudinal direction of the transducer and wherein said alloy and ceramic plates form a bar-type transducer.

5. The flexural transducer of claim 1 wherein said at least one alloy plate comprises one constant-modulus alloy plate coupled to a surface of said ceramic plate parallel to the residual polarization direction of said ceramic plate and wherein said lead means comprises a supporting and lead wire connected to said one constant-modulus alloy plate at a flexural vibration node and a lead wire connected to the surface of said ceramic plate opposite to the surface coupled to said alloy plate.

6. The flexural transducer of claim 1 wherein said at least one constant-modulus alloy plate is coupled to a surface of said ceramic plate parallel to the residual polarization direction of said ceramic plate.

7. The flexural transducer of claim 1, wherein the residual polarization direction of said piezoelectric ceramic plate is the same as the longitudinal direction of the transducer.

8. The flexural transducer of claim 7, wherein said at least one constant-modulus alloy is coupled to a surface of said ceramic plate perpendicular to the residual polarization direction of said ceramic plate and wherein said lead means comprises thin electrodes formed on opposite exposed surfaces of said ceramic plate parallel to the residual polarization direction of said ceramic plate.

9. The flexural transducer of claim 8 wherein said at least one alloy plate comprises first and second constant-modules alloy plates coupled to opposite surfaces of said piezoelectric ceramic plate.

10. The flexural transducer of claim 9 wherein said first and second alloy plates and said ceramic plate form a bar-type transducer.

11. The flexural transducer of claim 9 wherein said first alloy plate has two arms and said first and second alloy plates and said ceramic plate form a tuning fork-type transducer.

12. The flexural transducer of claim 8 wherein said at least one alloy plate comprises one constant-modulus alloy plate having two arms and wherein said ceramic plate is coupled to the end of one of said arms of the alloy plate to form a tuning fork-type transducer.

13. The flexural transducer of claim 12 wherein said first alloy plate has a length equal to that of said second alloy plate in the longitudinal direction of said transducer and said first ceramic plate has a length equal to that of said second ceramic plate in the longitudinal direction of said transducer.

14. The flexural transducer of claims 3, 4 or 9 wherein said first constant-modulus alloy plate has a length equal to that of said second constant-modulus alloy plate for generating even-order flexural vibrations in said transducer.

15. A flexural electromechanical transducer of elongated configuration comprising:
(a) a first constant-modulus alloy plate;
(b) a second constant-modulus alloy plate;
(c) a third constant-modulus apply plate;
(d) a first piezoelectric ceramic plate positioned between and mechanically coupled to said first and second constant-modulus alloy plates;
(e) a second piezoelectric ceramic plate positioned between and mechanically coupled to said second and third constant-modulus alloy plates, said first and second ceramic plates having opposite residual polarizations to each other in a direction perpendicular to the longitudinal direction of the transducer and having surfaces parallel to the polarization direction; and
(f) lead means electrically connected to said piezoelectric ceramic plate surfaces parallel to the polarization direction for applying a specified frequency signal to said parallel surfaces and obtaining a thickness-shear vibration mode of said ceramic plates and flexural vibration and said transducer, said lead means comprising first, second, and third supporting and lead wires respectively connected to said first, second, and third alloy plates at flexural vibration nodes.

16. The flexural transducer of claim 15 wherein said first second, and third constant-modulus alloy plates are coupled to surfaces of said respective ceramic plates parallel to the residual polarization direction of said ceramic plates, and wherein said alloy and ceramic plates form a bar-type transducer.

17. The flexural transducer of claim 15 wherein said second alloy plate has two arms and said first, second, and third alloy plates are coupled to surfaces of said respective ceramic plates parallel to the residual polarization of said ceramic plates, and wherein said alloy and ceramic plates form a tuning fork-type transducer.

18. A flexural electromechanical transducer of elongated configuration comprising:
(a) first and second constant-modulus alloy plates;
(b) first and second piezoelectric ceramic plates positioned between and mechanically coupled to said first and second alloy plates, said first and second ceramic plates having opposite residual polarizations to each other in a direction perpendicular to the longitudinal direction of the transducer; and
(c) lead means electrically connected to said ceramic plates for applying a specified frequency signal thereto and obtaining a thickness-shear vibration mode of said ceramic plates an flexural vibration of said transducer, said lead means comprising first lead means connected to said first alloy plate, second lead means connected to said second alloy plate, and third lead means positioned between and connected to said first and second ceramic plates.

19. The flexural transducer of claim 18 wherein said first and second lead means comprise first and second supporting and lead wires respectively connected to said first and second alloy plates at flexural vibration nodes.

20. The flexural transducer of claim 18 wherein said third lead means comprises a support and electrode metal plate having a first portion positioned between and mechanically coupled to said ceramic plates and a second portion extending out from between said ceramic plates.

21. The flexural transducer of claim 20 wherein said metal plate is positioned at the center of said transducer in the longitudinal direction.

22. The flexural transducer of claim 20 wherein said first portion of the support and electrode metal plate has a cross-section substantially equal to the cross-sections of said first and second ceramic plates and wherein said second portion of said metal plate has a cross-section substantially smaller than that of said first portion of the support and electrode metal plate.

23. The flexural transducer of claim 20 for a mechanical filter having at least one mechanical resonator with lead means for applying a specified frequency signal thereto and first and second mechanical couplers connected to said at least one mechanical resonator wherein said first constant-modulus alloy plate is connected to said first coupler and said second constant-modulus alloy plate is connected to said second coupler, and wherein said first and second lead means respectively comprise said first and second mechanical couplers.

* * * * *

UNITED STATES PATENT AND TRADEMARK OFFICE
CERTIFICATE OF CORRECTION

PATENT NO. : 4,281,298

DATED : July 28, 1981

INVENTOR(S) : Takashi Gounji et al.

It is certified that error appears in the above—identified patent and that said Letters Patent is hereby corrected as shown below:

[30] Foreign Application Priority Data: "Oct. 13" should be --Nov. 13--;

[56] References Cited, Other Publications: "JITSUGANSO" should be --JITSUGANSHO--.

Column 1, line 17, "esssence" should be --essence--;
Column 1, line 21, "is" should be --are--;
Column 9, line 45, after "numeral" insert --56--;
Column 9, line 55, "bandpass" should be --band pass--;
Column 11, line 4, "This" should be --Thin--;
Column 16, line 51, after "that" insert --the--;
Column 18, claim 15, line 5, "apply" should be --alloy--;
Column 18, claim 15, line 22, "and" should be --of--;
Column 18, claim 16, line 2, after "first" insert --,--;
Column 18, claim 18, line 13, "an" should be --and--.

Signed and Sealed this

Ninth Day of March 1982

[SEAL]

Attest:

GERALD J. MOSSINGHOFF

Attesting Officer  Commissioner of Patents and Trademarks